US010043584B2

United States Patent
Cartier et al.

(10) Patent No.: US 10,043,584 B2
(45) Date of Patent: Aug. 7, 2018

(54) THREE TERMINAL FUSE STRUCTURE CREATED BY OXYGEN VACANCY TRAPS IN HAFNIUM-BASED OXIDES

(71) Applicant: International Business Machines Corporation, Armonk, NY (US)

(72) Inventors: Eduard A. Cartier, New York, NY (US); Chandrasekharan Kothandaraman, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/337,594

(22) Filed: Oct. 28, 2016

(65) Prior Publication Data
US 2018/0122491 A1  May 3, 2018

(51) Int. Cl.
| | |
|---|---|
| *G11C 17/16* | (2006.01) |
| *H01L 29/51* | (2006.01) |
| *H01L 27/112* | (2006.01) |
| *G11C 17/18* | (2006.01) |
| *H01L 29/78* | (2006.01) |
| *H01L 23/525* | (2006.01) |

(52) U.S. Cl.
CPC ............ *G11C 17/165* (2013.01); *G11C 17/18* (2013.01); *H01L 23/5256* (2013.01); *H01L 27/11206* (2013.01); *H01L 29/517* (2013.01); *H01L 29/78* (2013.01)

(58) Field of Classification Search
CPC ............................... G11C 17/165; G11C 17/18
USPC .......................................................... 365/96
See application file for complete search history.

(56) References Cited

U.S. PATENT DOCUMENTS

| | | | |
|---|---|---|---|
| 6,690,601 B2 | 2/2004 | Yeh et al. | |
| 7,035,147 B2* | 4/2006 | Yeh et al. | G11C 16/04 365/185.29 |
| 8,787,064 B2 | 7/2014 | Kamins et al. | |
| 9,076,791 B1* | 7/2015 | Chi | H01L 29/513 |
| 2002/0185690 A1* | 12/2002 | Ueda | G11C 27/005 257/368 |
| 2009/0174428 A1* | 7/2009 | Karg | H01L 29/24 326/38 |
| 2009/0230463 A1* | 9/2009 | Carter | H01L 21/28114 257/327 |
| 2009/0283840 A1* | 11/2009 | Coolbaugh | H01L 23/5252 257/379 |

(Continued)

OTHER PUBLICATIONS

Yang Lu, "Conducting Nanofilaments in Metal Oxide Resistive Switching Memory," University of Pennsylvania, Qualifying Exam Manuscript, Department of Material Science and Engineering, May 6, 2013, 41 pages.

(Continued)

*Primary Examiner* — Son Mai
*Assistant Examiner* — Muna A Techane
(74) *Attorney, Agent, or Firm* — Vazken Alexanian; Ryan, Mason & Lewis, LLP

(57) ABSTRACT

A fuse structure includes a substrate, a gate dielectric formed on the substrate, a gate electrode formed on the gate dielectric, and first and second source/drain regions formed on the substrate on opposite sides with respect to the gate electrode, wherein the gate dielectric is configured such that a plurality of oxygen vacancies trapping respective charges are formed upon application of a pulse to the gate electrode.

14 Claims, 4 Drawing Sheets

(56) References Cited

U.S. PATENT DOCUMENTS

| | | | |
|---|---|---|---|
| 2012/0327700 A1* | 12/2012 | Li | G11C 17/16 365/104 |
| 2015/0126025 A1 | 5/2015 | Ando et al. | |
| 2015/0179632 A1 | 6/2015 | Sidelnicov et al. | |
| 2015/0236284 A1 | 8/2015 | Chan et al. | |
| 2015/0303204 A1* | 10/2015 | Kwon | H01L 27/1157 257/324 |
| 2015/0380517 A1 | 12/2015 | Afzali-Ardakani et al. | |

OTHER PUBLICATIONS

S.T. Hsu et al., "RRAM Switching Mechanism," IEEE Non-Volatile Memory Technology Symposium, Nov. 10, 2005, pp. 121-124.

B. Traoré et al., "HfO2-Based RRAM: Electrode Effects, Ti/HfO2 Interface, Charge Injection, and Oxygen (O) Defects Diffusion Through Experiment and Ab Initio Calculations," IEEE Transactions on Electron Devices, Jan. 2016, pp. 360-368, vol. 63, No. 1.

* cited by examiner

100

200

THREE TERMINAL FUSE STRUCTURE CREATED BY OXYGEN VACANCY TRAPS IN HAFNIUM-BASED OXIDES

BACKGROUND

Integrated circuits (ICs) and devices incorporating ICs may use fuses in connection with storage and programming of digital data. A known fuse is an electronic fuse (referred to as an "eFUSE") that includes a 2-terminal (e.g., anode and cathode) relatively low resistance resistor for use in connection with complementary metal-oxide semiconductor (CMOS) nodes.

Semiconductor structures or devices may be embodied as field-effect transistors (FETs), such as metal-oxide-semiconductor FETs (MOSFETs). Depending on doping, a FET may be, for example, an n-channel FET (n-FET) or a p-channel FET (p-FET).

Electron traps are associated with relatively shallow energy levels and are relatively easy to trap and de-trap. Thus, electron traps have been implemented in memory elements, in for example, n-FETs to perform conventional re-write types of operations. Hole traps, on the other hand, are associated with deeper energy levels, and take more energy to access than electron traps.

SUMMARY

Illustrative embodiments of the invention provide for a fuse structure, a one-time programmable memory device, and a method for programming a transistor. While illustrative embodiments are well-suited to improve operations of p-FET structures, alternative embodiments may be implemented with other types of semiconductor structures.

According to an exemplary embodiment of the present invention, a fuse structure includes a substrate, a gate dielectric formed on the substrate, a gate electrode formed on the gate dielectric, and first and second source/drain regions formed on the substrate on opposite sides with respect to the gate electrode, wherein the gate dielectric is configured such that a plurality of oxygen vacancies trapping respective charges are formed upon application of a pulse to the gate electrode.

According to an exemplary embodiment of the present invention, a one-time programmable memory device includes a p-type field effect transistor (p-FET), the p-FET including a gate dielectric formed on a substrate, a gate electrode formed on the gate dielectric, and first and second source/drain regions formed on the substrate on opposite sides with respect to the gate electrode, wherein the gate dielectric is configured such that a plurality of vacancies trapping respective charges are formed upon application of a pulse to the gate electrode.

According to an exemplary embodiment of the present invention, a method for programming a selected transistor includes selecting a transistor to program, wherein the selected transistor includes a gate dielectric formed on a substrate, and a gate electrode formed on the gate dielectric, and programming the selected transistor, wherein programming the selected transistor includes applying a pulse to the gate electrode of the selected transistor to form a plurality of vacancies in the gate dielectric trapping respective charges.

DETAILED DESCRIPTION

Figure 1:
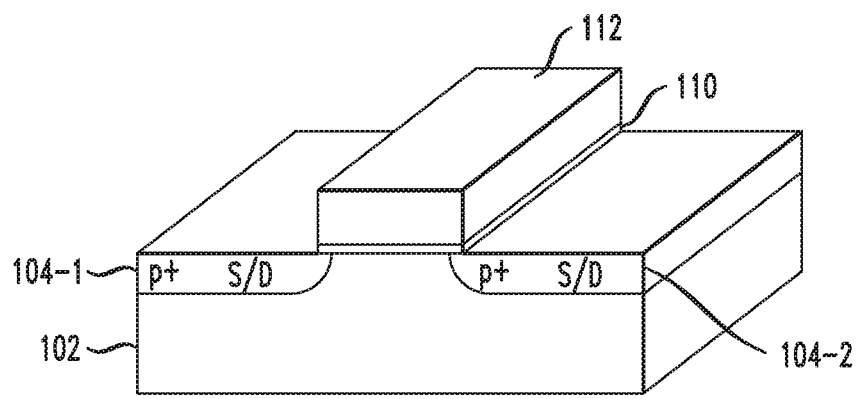
FIG. 1 is a three-dimensional view illustrating a transistor structure, according to an embodiment of the invention.

In illustrative embodiments, a semiconductor structure and associated method are provided. More particularly, illustrative embodiments describe a semiconductor structure that can be used to permanently store information, while also remaining difficult to detect.

It is to be understood that embodiments discussed herein are not limited to the particular materials, features, and processing steps shown and described herein. In particular, with respect to fabrication (forming or processing) steps, it is to be emphasized that the descriptions provided herein are not necessarily intended to encompass all of the steps that may be used to form a functional integrated circuit device. Rather, certain steps that are commonly used in fabricating such devices may not be described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

It is to be understood that one or more layers and/or regions of a type commonly used in field-effect transistor (FET), CMOS and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements.

The circuits, chips, transistors and other structures, and methods for forming or programming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the disclosed devices are contemplated embodiments of the invention. Given the teachings of embodiments of the invention provided herein, one of ordinary skill in the art will be able to contemplate other implementations and applications of embodiments of the invention.

A conventional eFUSE is an electrically programmable fuse having two terminals, and may have undesirable density and security characteristics. For example, a 2-terminal resistor in a CMOS circuit may require a large silicon area and reduce feature density in an IC. Also, a programmed conventional eFUSE or mask read-only memory (ROM) can be relatively easy to detect through imaging or confocal microscopy inspection. An eFUSE is programmed by applying a programming voltage to increase resistance (e.g., "blow the fuse"). Known eFUSEs relate to multi-time programmable memory (MTPM) elements. While some eFUSEs may be configured to permanently store information, these eFUSEs suffer from the security and density concerns noted above. Accordingly, it would be desirable to increase the security of stored information with a structure for high density applications that can permanently store information, while also remaining difficult to detect.

Embodiments of the present invention provide for a fuse element that can be used for one-time programmable (OTP) applications using vacancies in a dielectric. Vacancies in a dielectric, for example, oxygen vacancies, can trap charges. A vacancy, the absence of an atom in the structure of the dielectric, can possess a net negative charge or a net positive charge. Holes and electrons are the two types of charge carriers responsible for current in semiconductor materials and can be trapped in the vacancy. A positively charged vacancy would, typically, trap an electron and vice versa.

A vacancy that traps a positive charge, also referred to herein as a "hole trap," takes more energy to access than a vacancy that traps an electron (also referred to herein as an "electron trap"), and is, therefore, more robust than an electron trap. In other words, electron traps are shallower (in terms of energy levels with respect to a conduction band required to access), and easier to capture and de-trap than hole traps. Hole traps, on the other hand, are present at deeper energy levels than electron traps and take more energy to trap and de-trap than electron traps. The properties of hole traps make them useful for one time programmable (OTP) applications. In accordance with embodiments of the present invention, hole traps may be used in fuse and/or anti-fuse elements. The trapped charges may be utilized to make vacancy trap-based memory elements.

According to an embodiment of the present invention, a transistor-based fuse structure having at least three terminals uses oxygen vacancies in a hafnium oxide ($HfO_2$) gate dielectric to trap charges. For example, a gate, and two active regions on opposite sides of the gate (e.g., first and second source/drain regions) respectively correspond to first, second and third terminals of the fuse structure. The embodiments of the present invention are not necessarily limited to hafnium oxide, and may include other appropriate dielectrics for creating vacancies, such as, for example, hafnium silicate ($HfO_4Si$), silicon nitride (SiN), and silicon oxynitride (SiON). A fuse element, in accordance with an embodiment of the present invention, comprises a dielectric of a p-FET, which provides a dense solution and is compatible with dense array architectures. The fuse element uses hole traps, and can generate a permanent change in the threshold voltage ($V_t$) (the gate voltage when significant current starts flowing through (see FIG. 3)) of the p-FET.

With reference to FIG. 1, a transistor structure 100 is shown in accordance with an exemplary embodiment of the present invention. As shown, a substrate 102 includes first and second active regions 104-1 and 104-2 with p-type doping. The higher concentration of p-type dopant atoms than n-type dopant atoms is designated by the p+ notation. In this illustrative embodiment, transistor structure 100 is a p-type FET, or p-FET.

Active regions 104-1 and 104-2 form source/drain regions on opposite sides of a gate region. The gate region includes a gate dielectric 110 formed on substrate 102. The gate region further includes a gate electrode 112 formed on the gate dielectric 110. In one embodiment, the gate electrode 112 includes a high work function metal, such as, for example, tungsten (W), titanium (Ti), ruthenium (Ru), cobalt (Co), titanium nitride (TiN), or combinations thereof. Other appropriate materials may be used to form gate electrode 112, in accordance with the embodiments described herein.

Gate dielectric 110 include any material that can produce a suitable number of oxygen vacancies, or vacancies, in accordance with the embodiments described herein. For example, in one embodiment, gate dielectric 110 includes a hafnium-based compound, such as, for example, hafnium oxide ($HfO_2$) or hafnium silicate ($HfSiO_4$). However, any suitable dielectric compound that has a propensity to release oxygen atoms and form oxygen vacancies may be utilized in accordance with the embodiments described herein. Other non-hafnium-based dielectrics can be used as the gate dielectric 110. A vertical thickness of the gate dielectric 110 can be, for example, in the range of about 1 to about 3 nm.

The vacancies (e.g., oxygen vacancies) formed in gate dielectric 110 have propensity to trap charge carriers. As noted above, hole traps are present at deeper energy levels than electron traps and take more energy to trap and de-trap carriers and hence are more permanent, making the hole traps useful for OTP applications. In accordance with an embodiment of the present invention, the formation the vacancies trapping charges (e.g., hole traps) cause a permanent change in device characteristics, such as, for example, a permanent change in threshold voltage ($V_t$). As uses herein, "permanent" or "permanently" can refer to a stable change in characteristics that is not subject to further modification, or is not readily or easily changed such that the change is considered to be a final or one-time occurrence, such as a one-time programming operation.

Figure 2:
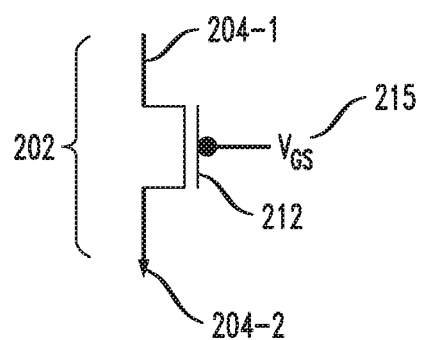
FIG. 2 is illustrates a circuit diagram depicting an application of a pulse to a gate of a transistor, according to an embodiment of the invention.

The embodiments described herein make use of a p-FET with hole trapping to generate permanent change in the $V_t$. With reference to FIG. 2, circuit diagram 200, in accordance with the embodiments described herein, shows a transistor 202 having a source region 204-1, drain region 204-2 and gate 212. As shown, pulse 215 is applied to a terminal of a gate electrode. In one embodiment, pulse 215 is a negative voltage pulse. For example, pulse 215 may illustratively have a gate-source voltage ($V_{GS}$) of −3.0V and an associated pulse width of approximately 50 ns. A magnitude of the pulse applied to the gate electrode can range from, for example, −2V to −4V, while the source voltage is kept at 1.0V and the drain voltage is kept at 0V.

When the negative pulse is applied to the gate electrode, a plurality of vacancies (e.g., oxygen vacancies) in the gate dielectric are formed, and the holes in the channel of the transistor are trapped, thus causing a $V_t$ shift. When the negative voltage is applied, the p-FET is turned on (i.e., $V_{GS}$ is negative), which results in the flow of holes from the source to the drain. Simultaneously, the gate dielectric sees a large negative electric field that attracts some of the holes into the dielectric; this enables a fraction of the holes to be trapped in the vacancies present in the dielectric. In addition, the large electric field also assists in the generation of vacancies that behave as hole traps.

A semiconductor memory device may be programmed by applying a pulse having a particular voltage and associated pulse width to a selected transistor, with such programming allowing the semiconductor memory device to permanently store information. Programming the semiconductor memory device in this manner makes permanently storing information relatively difficult to detect by imaging or confocal microscopy techniques. Accordingly, permanently storing information in accordance with the embodiments described herein increases security associated with semiconductor memory devices, as compared to conventional methods.

Figure 3:
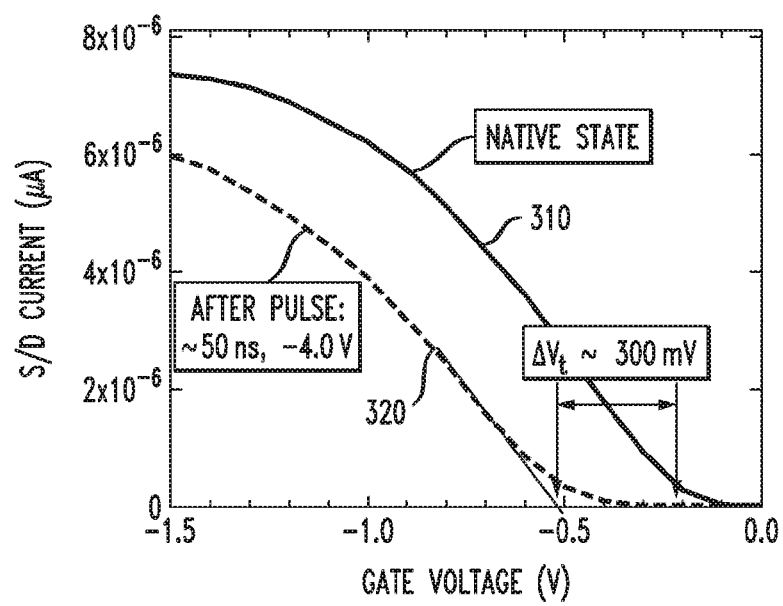
FIG. 3 is a chart illustrating the effect on threshold voltage of an application of a pulse to a gate electrode of a transistor, according to an embodiment of the invention.

With reference to FIG. 3, a chart 300 is provided illustrating the effect of application of a pulse to a transistor, according to an exemplary embodiment of the present invention. Chart 300 plots the source/drain (S/D) current, in microamps, as a function of gate voltage both before and after a pulse being applied to a gate electrode of the transistor. For example, as shown, the application of a −4.0V pulse having a width of 50 ns results in an approximate $V_t$ reduction ($\Delta V_t$) of 300 mV between curves 310 and 320 respectively corresponding to before (native state) and after pulse application. The pulse applied to the gate electrode of the transistor structure has permanently changed the threshold voltage ($V_t$) of the p-FET. In accordance with embodiments of the present invention, the threshold voltage ($V_t$) can be changed by an amount of about 100 mV to about 500 mV.

Figure 4:
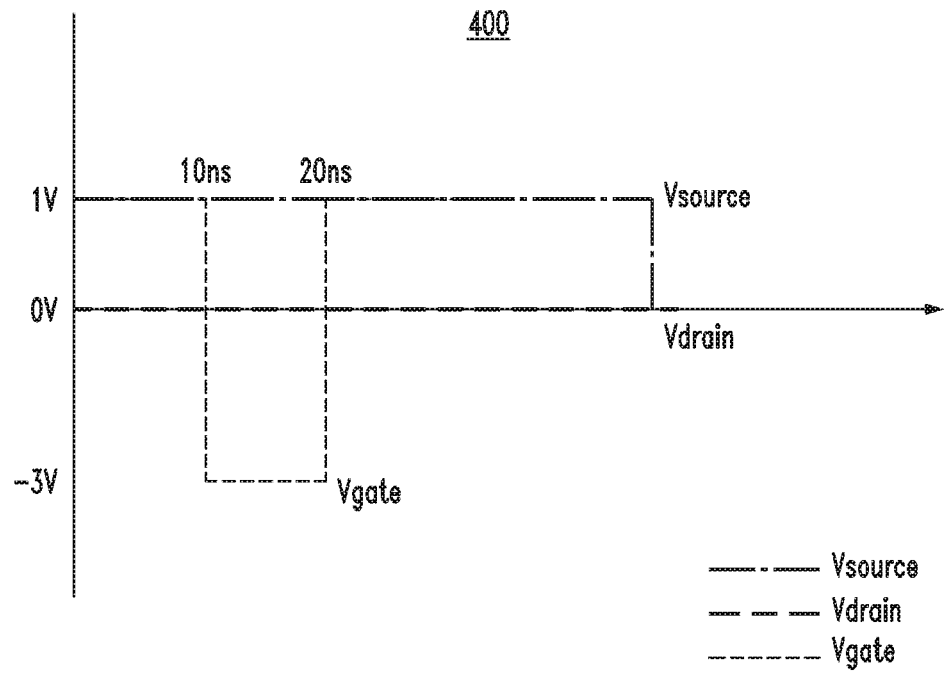
FIG. 4 is a timing diagram corresponding to a pulse applied to gate electrode of a transistor, according to an embodiment of the invention.

With reference to FIG. 4, timing diagram 400 is provided illustrating a pulse applied to a gate electrode to program a transistor, according to an exemplary embodiment of the present invention. Referring to FIG. 4, a p-FET is in the OFF state before the onset of programming at 10 ns. The $V_{gate}$ of the p-FET equals $V_{source}$ for the PFET to be OFF. For example, referring to FIG. 4, initially the gate voltage=1V, then the gate is pulsed to −3V. As a result, $V_{GS}$=−4, then $V_{gate}$ returns back to 1V ($V_{GS}$=0) at 20 ns after the pulse is completed. It is to be understood that the embodiments of the present invention are not necessarily limited to the values illustrated in the timing diagram of FIG. 4. For example, a magnitude of the pulse applied to the gate electrode can be about −2V to about −4V relative to the source voltage, the pulse width can range from about 10 nanoseconds to about 10 microseconds.

Figure 5:
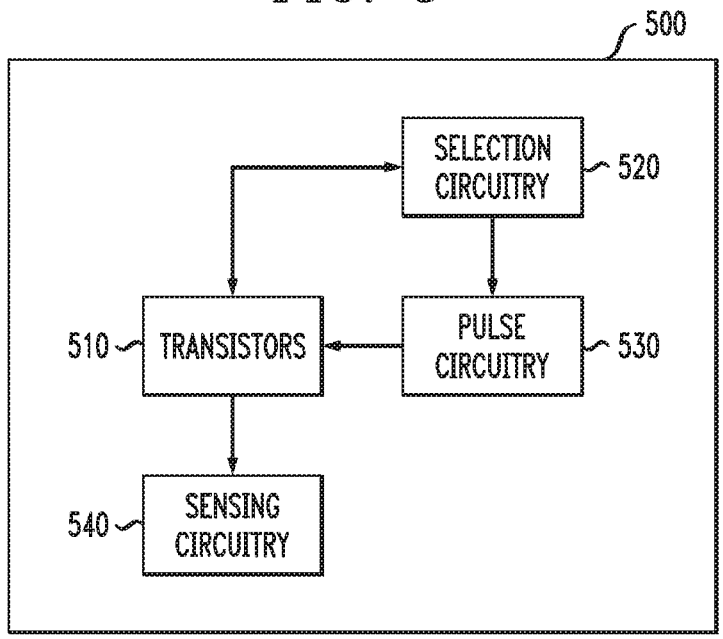
FIG. 5 is a block diagram of a chip including transistors configured to be used a fuse structures, according to an exemplary embodiment of the present invention.

FIG. 5 is a block diagram of a chip including transistors configured to be used a fuse structures, according to an exemplary embodiment of the present invention. As shown in FIG. 5 by lines and/or arrows, the components of the chip 500, such as a memory chip, are operatively connected to each other via, for example, physical connections, such as wired and/or direct electrical contact connections as part of, for example, one or more integrated circuits. Referring to FIG. 5, the chip 500 includes a plurality of transistors 510 configured in accordance with embodiments of the present invention to be part of one-time programmable memory devices. The transistors are, for example p-FETs including a gate dielectric, such as, for example, hafnium oxide, which forms oxygen vacancies trapping charges upon application of a pulse to a gate electrode of the transistor. The chip 500 further includes selection circuitry 520 which selects one or more of the plurality of transistors to receive the pulse and be programmed. The pulse circuitry 530 receives an input from the selection circuitry 520 that a transistor has been selected, and transmits the appropriate pulse to reach a gate electrode of the selected transistor. The chip 500 further includes sensing circuitry 540, which is configured to sense a change in threshold voltage of a programmed transistor by, for example, detecting a change in current required to activate a gate of a programmed transistor.

Figure 6:
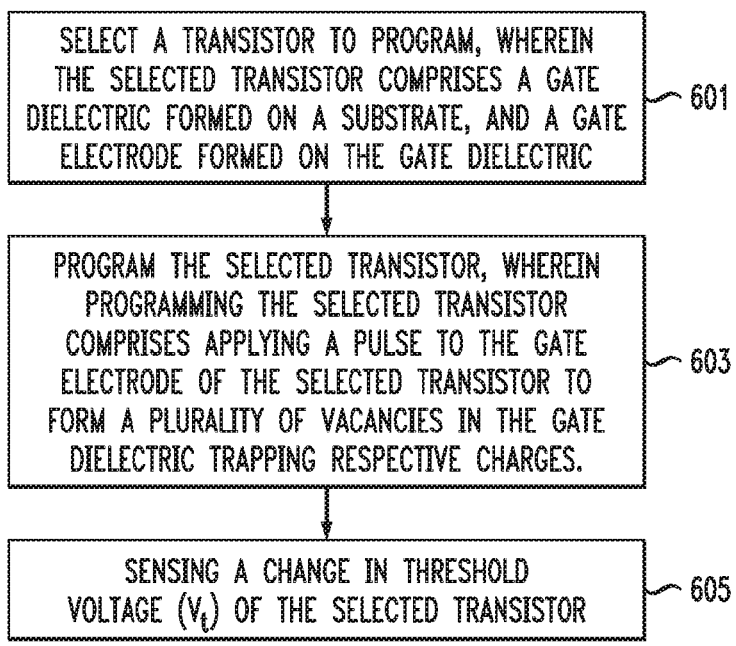
FIG. 6 is a flow diagram of a process for programming a selected transistor, according to an exemplary embodiment of the invention.

FIG. 6 is a flow diagram of a process for programming a selected transistor, according to an exemplary embodiment of the invention. Referring to FIG. 6, the process 600 includes, at block 601, selecting a transistor to program, wherein the selected transistor comprises a gate dielectric formed on a substrate, and a gate electrode formed on the gate dielectric. As noted above, the selected transistor is a p-FET and the gate dielectric includes a hafnium compound. The process 600 further includes, at block 603, programming the selected transistor. Programming includes applying a pulse to the gate electrode of the selected transistor to form a plurality of vacancies in the gate dielectric trapping respective charges. As a result, a threshold voltage of the transistor is permanently changed. The process 600 further includes, at block 605, sensing a change in threshold voltage ($V_t$) of the selected transistor using, for example, sensing circuitry 540, to determine which transistors have been programmed.

The three-terminal structure described herein provides significantly increased density over conventional electronic programming structure, such as eFUSEs. For example, in a non-limiting example, an eFUSE may be associated with an area of about 3 square micrometers, while the area of fuse structure comprising a plurality of three-terminal transistor structures described herein may be associated with an area about 20 times less than that of the eFUSE, for example, about 0.15 square micrometers. Unlike conventional eFUSEs, the three-terminal structure in accordance with the embodiments of the present invention is a highly scalable approach to electronic programming. Additionally, the embodiments of the present invention described herein enable permanent storage of information, while being difficult to detect relative to other methodologies. For example, mask ROMs can be detected from a visual inspection of images, and confocal microscopy inspection can be used to determine which eFUSEs have been programmed. However, with respect to the hole trapping embodiments described herein, programmed devices are not detected by visual inspection, and instead require actual taking of measurements to detect changes in threshold voltage in order to determine which transistor(s) have been programmed.

It is to be understood that the embodiments described herein can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by a fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
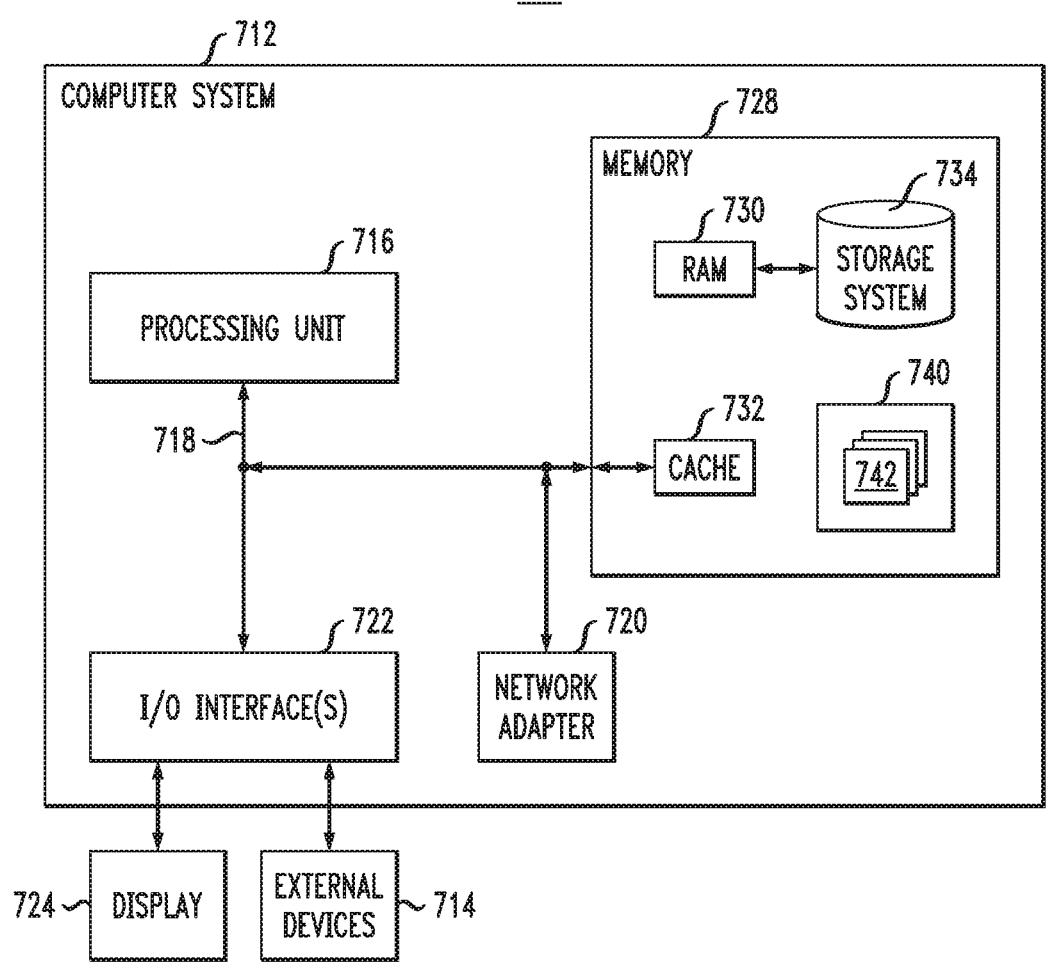
FIG. 7 illustrates a computer system in accordance with which one or more components/steps of the techniques of the invention may be implemented, according to an exemplary embodiment of the invention.

One or more embodiments can make use of software running on a general-purpose computer or workstation. With reference to FIG. 7, in a computing node 710 there is a computer system/server 712, which is operational with numerous other general purpose or special purpose computing system environments or configurations. Examples of well-known computing systems, environments, and/or configurations that may be suitable for use with computer system/server 712 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 712 may be described in the general context of computer system executable instructions, such as program modules, being executed by a computer system. Generally, program modules may include routines, programs, objects, components, logic, data structures, and so on that perform particular tasks or implement particular abstract data types. Computer system/server 712 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 712 in computing node 710 is shown in the form of a general-purpose computing device. The components of computer system/server 712 may include, but are not limited to, one or more processors or processing units 716, a system memory 728, and a bus 718 that couples various system components including system memory 728 to processor 716.

The bus 718 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 712 typically includes a variety of computer system readable media. Such media may be any available media that is accessible by computer system/server 712, and it includes both volatile and non-volatile media, removable and non-removable media.

The system memory 728 can include computer system readable media in the form of volatile memory, such as random access memory (RAM) 730 and/or cache memory 732. The computer system/server 712 may further include other removable/non-removable, volatile/nonvolatile computer system storage media. By way of example only, storage system 734 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 718 by one or more data media interfaces. As depicted and described herein, the memory 728 may include at least one program product having a set (e.g., at least one) of program modules that are configured to carry out the functions of embodiments of the invention. A program/utility 740, having a set (at least one) of program modules 742, may be stored in memory 728 by way of example, and not limitation, as well as an operating system, one or more application programs, other program modules, and program data. Each of the operating system, one or more application programs, other program modules, and program data or some combination thereof, may include an implementation of a networking environment. Program modules 742 generally carry out the functions and/or methodologies of embodiments of the invention as described herein.

Computer system/server 712 may also communicate with one or more external devices 714 such as a keyboard, a pointing device, a display 724, etc., one or more devices that enable a user to interact with computer system/server 712, and/or any devices (e.g., network card, modem, etc.) that enable computer system/server 712 to communicate with one or more other computing devices. Such communication can occur via Input/Output (I/O) interfaces 722. Still yet, computer system/server 712 can communicate with one or more networks such as a local area network (LAN), a general wide area network (WAN), and/or a public network (e.g., the Internet) via network adapter 720. As depicted, network adapter 720 communicates with the other components of computer system/server 712 via bus 718. It should be understood that although not shown, other hardware and/or software components could be used in conjunction with computer system/server 712. Examples, include, but are not limited to: microcode, device drivers, redundant processing units, external disk drive arrays, RAID systems, tape drives, and data archival storage systems, etc.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A fuse structure comprising:
   a substrate;
   a gate dielectric formed on the substrate;
   a gate electrode formed on the gate dielectric; and
   first and second source/drain regions formed on the substrate on opposite sides with respect to the gate electrode;
   wherein the first and second source/drain regions and gate electrode correspond to a transistor; and
   wherein the gate dielectric is configured such that a plurality of oxygen vacancies trapping respective charges are formed within the gate dielectric upon application of a pulse to the gate electrode;

wherein the pulse is applied to the gate electrode while maintaining a source voltage and a drain voltage at constant levels;

wherein a magnitude of the pulse applied to the gate electrode is negative relative to the source voltage; and wherein the application of the pulse to the gate electrode permanently changes a threshold voltage ($V_t$) of the transistor.

2. The fuse structure of claim 1, wherein the gate electrode, and the first and second source/drain regions respectively correspond to first, second and third terminals of the fuse structure.

3. The fuse structure of claim 1, wherein the gate dielectric comprises hafnium.

4. The fuse structure of claim 3, wherein the gate dielectric comprises hafnium dioxide ($HfO_2$).

5. The fuse structure of claim 3, wherein the gate dielectric comprises hafnium silicate ($HfSiO_4$).

6. The fuse structure of claim 1, wherein the transistor is a p-type field effect transistor (p-FET).

7. The fuse structure of claim 1, wherein the threshold voltage ($V_t$) is changed by an amount of about 100 mV to about 500 mV.

8. The fuse structure of claim 1, wherein a magnitude of the pulse applied to the gate electrode is about −3V to about −4V relative to a source voltage.

9. A one-time programmable memory device, comprising:
a p-type field effect transistor (p-FET), the p-FET comprising:
a gate dielectric formed on a substrate;
a gate electrode formed on the gate dielectric; and
first and second source/drain regions formed on the substrate on opposite sides with respect to the gate electrode;
wherein the gate dielectric is configured such that a plurality of vacancies trapping respective charges are formed within the gate dielectric upon application of a pulse to the gate electrode;
wherein the pulse is applied to the gate electrode while maintaining a source voltage and a drain voltage at constant levels; and
wherein a magnitude of the pulse applied to the gate electrode is negative relative to the source voltage; and
wherein the application of the pulse to the gate electrode permanently changes a threshold voltage ($V_t$) of the p-FET.

10. The one-time programmable memory device of claim 9, wherein the gate dielectric is selected from the group consisting of hafnium dioxide ($HfO_2$) and hafnium silicate ($HfSiO_4$).

11. The one-time programmable memory device of claim 9, wherein the vacancies comprise oxygen vacancies.

12. A method comprising:
selecting a transistor to program, wherein the selected transistor comprises a gate dielectric formed on a substrate, and a gate electrode formed on the gate dielectric; and
programming the selected transistor;
wherein programming the selected transistor comprises:
applying a pulse to the gate electrode of the selected transistor to form a plurality of vacancies in the gate dielectric trapping respective charges;
wherein the pulse is applied to the gate electrode while maintaining a source voltage and a drain voltage at constant levels; and
wherein a magnitude of the pulse applied to the gate electrode is negative relative to the source voltage; and
wherein the programming permanently changes a threshold voltage ($V_t$) of the selected transistor.

13. The method of claim 12, wherein the selected transistor is a p-type field effect transistor (p-FET).

14. The method of claim 12, wherein the vacancies comprise oxygen vacancies.

* * * * *